United States Patent
Lin et al.

(10) Patent No.: US 9,614,074 B1
(45) Date of Patent: Apr. 4, 2017

(54) PARTIAL, SELF-BIASED ISOLATION IN SEMICONDUCTOR DEVICES

(71) Applicant: Freescale Semiconductor, Inc., Austin, TX (US)

(72) Inventors: Xin Lin, Phoenix, AZ (US); Hongning Yang, Chandler, AZ (US); Jiang-Kai Zuo, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/076,617

(22) Filed: Mar. 21, 2016

(51) Int. Cl.
| | | |
|---|---|---|
| *H01L 29/78* | (2006.01) | |
| *H01L 29/66* | (2006.01) | |
| *H01L 29/10* | (2006.01) | |
| *H01L 29/06* | (2006.01) | |
| *H01L 21/265* | (2006.01) | |

(52) U.S. Cl.
CPC ........ *H01L 29/7823* (2013.01); *H01L 21/265* (2013.01); *H01L 29/063* (2013.01); *H01L 29/1095* (2013.01); *H01L 29/66681* (2013.01)

(58) Field of Classification Search
None
See application file for complete search history.

(56) References Cited

U.S. PATENT DOCUMENTS

| | | |
|---|---|---|
| 6,882,023 B2 | 4/2005 | Khemka et al. |
| 8,541,862 B2 | 9/2013 | Yang et al. |
| 9,508,845 B1 * | 11/2016 | Lin ............... H01L 29/0634 |
| 2014/0001548 A1 * | 1/2014 | Chen ............ H01L 27/0727 257/337 |
| 2014/0001549 A1 * | 1/2014 | Bode ............ H01L 29/66659 257/337 |
| 2015/0380398 A1 * | 12/2015 | Mallikarjunaswamy ........ H01L 29/7823 257/272 |

OTHER PUBLICATIONS

U.S. Appl. No. 14/851,355.
U.S. Appl. No. 14/851,360.

* cited by examiner

*Primary Examiner* — Erik Kielin

(57) ABSTRACT

A device includes a semiconductor substrate, a buried doped isolation layer disposed in the semiconductor substrate to isolate the device, a body region disposed in the semiconductor substrate and to which a voltage is applied during operation and in which a channel is formed during operation, and a depletion region disposed in the semiconductor substrate and having a conductivity type in common with the buried doped isolation barrier and the body region. The depletion region reaches a depth in the semiconductor substrate to be in contact with the buried doped isolation layer. The depletion region establishes an electrical link between the buried doped isolation layer and the body region such that the buried doped isolation layer is biased at a voltage level lower than the voltage applied to the body region.

17 Claims, 3 Drawing Sheets

PARTIAL, SELF-BIASED ISOLATION IN SEMICONDUCTOR DEVICES

FIELD OF INVENTION

The present embodiments relate to semiconductor devices.

BACKGROUND

Integrated circuits (ICs) and other electronic devices often include arrangements of interconnected field effect transistors (FETs), also called metal-oxide-semiconductor (MOS) field effect transistors (MOSFETs), or simply MOS transistors or devices. A typical MOS transistor includes a gate electrode as a control electrode and spaced apart source and drain electrodes. A control voltage applied to the gate electrode controls the flow of current through a controllable conductive channel between the source and drain electrodes.

Power transistor devices are designed to be tolerant of the high currents and voltages that are present in power applications such as motion control, air bag deployment, and automotive fuel injector drivers. One type of power MOS transistor is a laterally diffused metal-oxide-semiconductor (LDMOS) transistor. In an LDMOS device, a drift space is provided between the channel region and the drain region.

LDMOS devices may be designed to operate in a high-side configuration in which all of the device terminals are level shifted with respect to the substrate potential. Devices configured for high-side operation have been applied in power switchers in DC-to-DC converters, which have respective LDMOS devices for the high side and low side. High-side capable devices are designed to prevent a direct forward bias or punch-through path from a body region of the LDMOS device to an underlying substrate.

LDMOS devices are often used in applications, such as automotive applications, involving operational voltages greater than 40 volts. Breakdown resulting from applying such high voltages to the source and body in a p-channel LDMOS device is often prevented through a reduced surface field (RESURF) structure in the LDMOS device design. The RESURF structure is designed to deplete the drift space of the LDMOS device in both vertical and lateral directions, thereby reducing the electric field near the surface at the drift region and thus raising the off-state breakdown voltage (BVdss) of the device.

Some LDMOS devices have a "double RESURF" structure. For example, in n-channel LDMOS devices, the drift space contains an upper level n-type region and a lower level p-type region, with an n-type buried isolation layer beneath the p-type region. The double nature of the structure refers to the depletion of the two regions and the reduction of the electric field in the related junction areas. Double RESURF structures typically apply the drain voltage to isolation regions in an n-channel device in order to deplete both the n-type and p-type regions.

However, biasing the isolation regions at the drain voltage (for an n-channel device) or the body voltage (in a p-channel device) increases the field stress between a buried isolation layer and either the body (for the n-channel device) or the drift region (for the p-channel device). Breakdown may instead occur between the body (or drift region) and the buried isolation layer, thereby limiting the breakdown voltage. Previous efforts to address such breakdown have introduced fabrication challenges or degraded the electrostatic discharge (ESD) and safe operating area (SOA) performance of the device.

BRIEF DESCRIPTION OF THE DRAWINGS

The components and the figures are not necessarily to scale, emphasis instead being placed upon illustrating the principles of the various embodiments. Moreover, in the figures, like reference numerals designate corresponding parts throughout the different views.

DETAILED DESCRIPTION OF THE PRESENTLY PREFERRED EMBODIMENTS

Embodiments of laterally diffused metal oxide semiconductor (LDMOS) and other power transistor devices and electronic apparatus with self-biased isolation are described, along with methods of fabricating such devices and apparatus. Isolation regions may be partially lifted to a bias voltage level using a well region that couples the isolation regions to a bias voltage applied to a body region. The well region is positioned and otherwise configured to be depleted of charge carriers. As a result, some of the bias voltage applied to the body region is sustained across the depleted well region. Only a portion of the bias voltage is therefore passed on to the isolation regions. The depleted well region thus provides partial biasing, or lifting, of the isolation potential.

The self-biasing and partial lifting of the isolation potential avoids biasing the isolation regions at voltage levels that would otherwise establish the breakdown voltage level of the device. With significantly less voltage stress between the isolation regions and a drift region of the device, much higher breakdown voltage levels (e.g., BVDSS levels) may be achieved. The safe operating area of the device may also be improved.

The depleted well region establishes an electrical link between the high potential body region and a buried doped isolation layer of a doped isolation barrier. The electrical link may be primarily vertically oriented. For instance, the depleted well region may extend from the body region of the device to reach the buried doped isolation layer. With a vertical link, the overall device size may not increase. Performance parameters related to device size, such as resistance, are thus not adversely affected.

The depleted well region also protects a deep trench isolation (DTI) region along the device periphery. The depleted well region partially biases the isolation regions adjacent the DTI region. As a result, additional breakdown protection for the DTI region is naturally provided. The protection is provided without increasing device footprint.

The depleted well region may be formed using a pre-existing implant. The partial biasing of the isolation regions may be achieved without adding any process steps. The pre-existing implant may be directed to forming a drift region of another field effect transistor device. An increase in fabrication costs is accordingly avoided.

Figure 1:
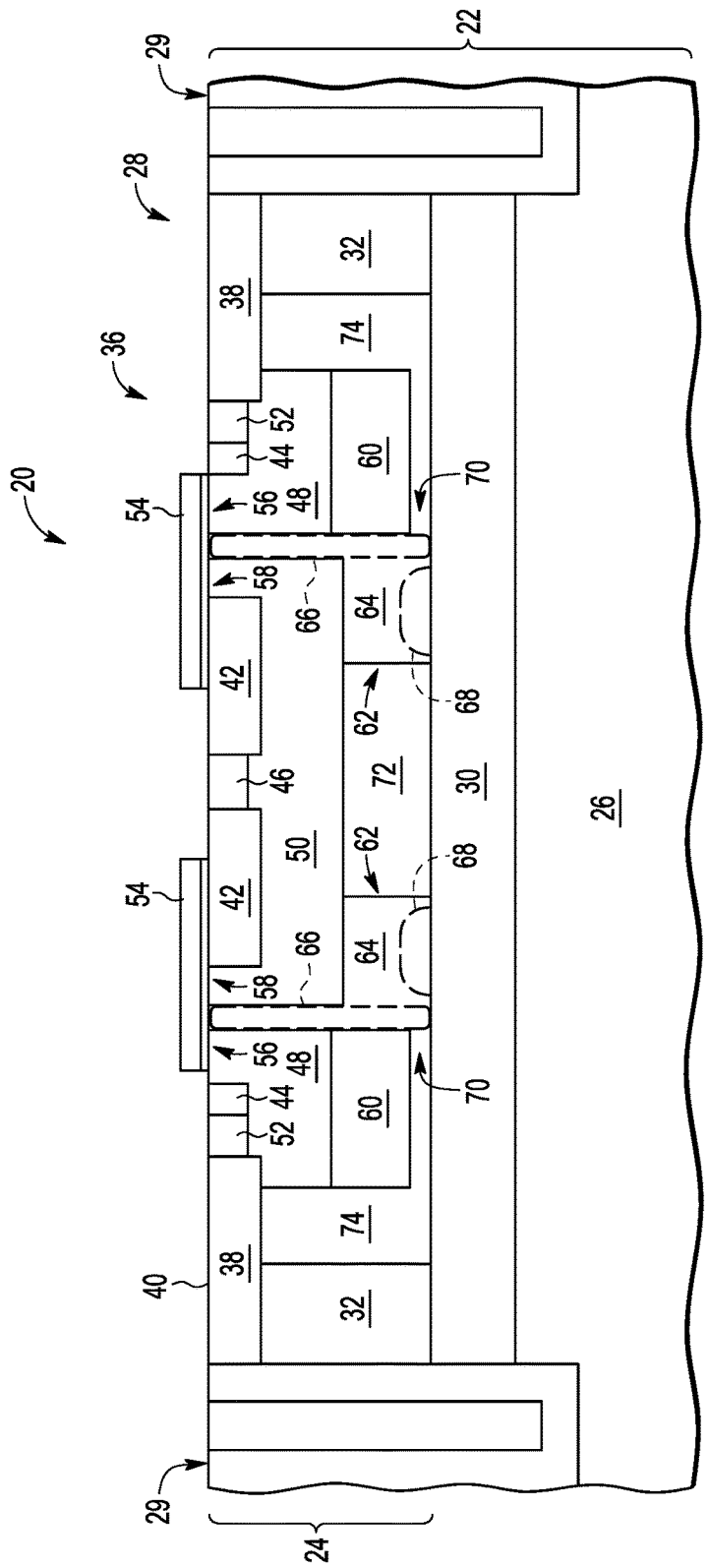
FIG. 1 is a cross-sectional, schematic view of an exemplary p-channel LDMOS (or PLDMOS) transistor with self-biased isolation in accordance with one embodiment.

FIG. 1 is a schematic cross-sectional view of an example of an LDMOS device 20 constructed in accordance with one embodiment. In this embodiment, the device 20 is configured as a p-channel device. The device 20 may be configured as a RESURF transistor.

The device 20 includes a semiconductor substrate 22, which may, in turn, include a number of epitaxial layers 24. In this example, the semiconductor substrate 22 includes a single p-type epitaxial layer 24 grown on an original, bulk substrate 26. The original substrate 26 may be a heavily doped p-type substrate in some cases, such as those having multiple epitaxial layers. The substrate 22 may be biased by a substrate contact region (not shown). The device 20 may alternatively or additionally include non-epitaxial layers in which one or more device regions are formed.

Any one or more of the layers of the semiconductor substrate 22 may include silicon. Alternative or additional semiconductor materials may be used in other embodiments. The structural, material, and other characteristics of the semiconductor substrate 22 may vary from the example shown. Although useful for increasing the breakdown voltage in connection with bulk substrates, the disclosed embodiments are not limited to bulk substrates. For example, the semiconductor substrate 22 may be or include a silicon-on-insulator (SOI) substrate. Additional, fewer, or alternative layers may be included in the semiconductor substrate 22. For example, any number of additional semiconductor and/or non-semiconductor layers may be included. The disclosed devices are thus not limited to, for instance, bulk silicon substrates or substrates including epitaxially grown layers, and instead may be supported by a wide variety of other types of semiconductor substrates.

A device area 28 of the device 20 is depicted in FIG. 1. In this case, the device area 28 has two mirrored sides. For example, the device 20 may be laterally symmetrical about a central region, e.g., a drain region, as described below. In other cases, the device 20 is also symmetrical in the other lateral direction. In still other cases, the device 20 is not laterally symmetrical. For example, the device area 28 may correspond with only one side of the device area 28 shown in FIG. 1.

The device area 28 may be defined by one or more device isolating layers or other regions in the semiconductor substrate 22 (e.g., the epitaxial layer 24). The regions may be or include doped semiconductor regions and/or undoped (e.g., dielectric) regions. In this example, the device area 28 is defined by a deep-trench isolation (DTI) ring 29. The structures in the device area 28 are laterally isolated from a remainder of the substrate 22 by the deep-trench isolation (DTI) ring 29. In other cases, the device 20 does not include the DTI ring 29.

A doped isolation barrier is provided for further isolation of the device 20. The doped isolation barrier may be disposed along the periphery of the device area 28. The doped isolation barrier may include a number of doped isolation layers and regions provided within the DTI ring 29 along the periphery of the device area 28. The layers and regions of the doped isolation barrier may laterally and/or otherwise surround the remainder of the device area 28 for further isolation of the device 20. For instance, the regions or layers of the doped isolation barrier may form an isolation tub in which the active components of the device 20 are disposed. The isolation tub includes a bottom and sidewalls extending upward from the bottom. In this example, the doped isolation barrier includes a buried isolation layer 30 that defines a bottom of the isolation tub. The doped isolation barrier also includes one or more ring-shaped isolation wells 32 that define sidewalls of the isolation tub. The isolation wells 32 may be stacked upon one another. The isolation well(s) 32 is/are in contact with the buried isolation layer 30 to electrically connect the doped isolation barrier for the device 20. In other cases, any number of wells may be used to define the sidewalls. In this example, with a p-type substrate, the regions and layers of the doped isolation barrier are n-type regions.

Within the doped isolation barrier is a core device area 36 of the device 20. The core device area 36 may correspond with the active area of the device 20, i.e., the subset of the device area 28 in which the active components of the device 20 are disposed. In the symmetrical example of FIG. 1, the core device area 36 corresponds with the area extending from an outer terminal (e.g., a body contact as described below) inward. The buried isolation layer 30 extends across the entire lateral extent of the core device area 36. The lateral extent of the core device area 36 is defined in this example by an isolation region 38 disposed along a surface 40 of the substrate 22. The isolation region 38 extends laterally inward from the DTI region 29. In this case, the isolation region 38 is a shallow trench isolation (STI) region. The isolation region 38 may thus be ring-shaped to laterally surround the core device area 36.

The device 20 may include a number of other isolation regions (e.g., STI regions) to further define the active areas of the device 20. In this example, the device 20 includes a field isolation region 42 that establishes the length of the drift portion of the conduction path of the device. Additional or alternative isolation regions may be included. In other cases, the device 20 includes fewer isolation regions. For example, the device 20 may be configured with an active drift arrangement.

The buried isolation layer 30 may be formed in the semiconductor substrate 22 before the growth of the epitaxial layer 24 thereof. The buried isolation layer 30 may thus extend laterally across and under the regions disposed, and later formed, in the core device area 36. Alternatively or additionally, some or all of the buried isolation layer 30 is formed in the epitaxial layer(s) 24. The buried isolation layer 30 may assist in depletion of a drift region of the device 20 to support the RESURF effect, as described below.

One or more of the layers and regions of the doped isolation barrier may have a dopant concentration level and/or be otherwise configured for high voltage (HV) operation (e.g., high side operation in which the terminals of the device 20 are level shifted relative to the semiconductor substrate 22, which may be grounded). For example, the higher dopant concentration level of the isolation barrier layer may be useful in preventing punch-through. Any number of the device isolation wells, sinks, or buried layers may or may not be connected to one another. Additional, fewer, or alternative device isolation layers or regions may be provided in the semiconductor substrate 22.

Within the core device area 36, the device 20 includes a source region 44, a drain region 46, a body region 48 in which the source region 44 is disposed, and a drift region 50 in which the drain region 46 is disposed. In this example, the body region 48 is an n-type well formed in the epitaxial layer 24 of the substrate 22. The body region 48 may be biased via one or more heavily doped n-type body contact regions or electrodes 52 formed in or otherwise above the n-type well of the body region 48 in the semiconductor substrate 22. The dopant concentration of each contact region 52 may be at a level sufficient to establish an ohmic contact to the body region 48.

The source and drain regions 44 and 46 are laterally spaced from one another in the lateral dimension shown in the cross-section of FIG. 1. In the symmetrical example of FIG. 1, the source region 44 surrounds a centrally disposed drain region 46. Any number of source or drain regions 44, 46 may be provided in various arrangements. In this example, the source and drain regions 44 and 46 are heavily doped p-type portions of the epitaxial layer 24. The heavily doped p-type source region 44 is disposed within, on, and/or otherwise above the body region 48. The heavily p-type doped drain region 46 is spaced from the body region 48 along the lateral dimension shown in FIG. 1. Such spacing defines a conduction path of the device between the source and drain regions 44 and 46. The regions 44, 46, or a portion thereof, may have a dopant concentration at a level sufficient to establish ohmic contacts for biasing the drain region 46 and the source region 44. In this p-channel LDMOS configuration, the drain region 46 is biased at a drain-source voltage, Vds, relative to the source region 44. In a typical p-channel LDMOS configuration, the drain region 46 is biased at a relatively low voltage relative to the source/body bias voltage. The bias voltage may be negative. In some cases, the drain-source voltage, Vds, in a high-side automotive switch application may fall in a range from about 0 to about −230 Volts, with the drain region 46 in a range from about 150 to about −80 Volts and the source region 44 at about +150 Volts.

The device 20 includes one or more gate structures 54 formed on or above the surface 40 of the semiconductor substrate 22. In the example of FIG. 1, the device 20 may include a pair of gate structures 54, or a single ring-shaped gate structure 54. The regions in the core device area 36 may also be ring-shaped (with the exception of those positioned in the center, such as the drain and drift regions 46, 50). In these and other cases, the core device area 36 may have a rectangular layout. The gate structure 54 is disposed between the source region 44 and the drain region 46. The gate structure 54 includes a polysilicon or other conductive plate located on or above a gate dielectric. For example, the gate dielectric may include silicon dioxide (or oxide) deposited or otherwise formed on the surface 40.

The gate structure 54 may include one or more dielectric sidewall spacers disposed along lateral edges of the gate structure 54. The sidewall spacers may cover the lateral edges to act as a silicide blocker to prevent a silicide short along the surface of the substrate 22. The sidewall spacers may provide spacing to separate the conductive components of the gate structure 54 from the source region 44 and other regions or structures within the core device area 36. In this example, one of the sidewall spacers is used for alignment purposes in defining an edge of the source region 44.

In the example of FIG. 1, the device 20 is laterally symmetrical about the drain region 46. The drain region 46 may be centered or otherwise internally disposed within the core device area 36. In this case, the source and body regions 44, 48 are ring-shaped regions that laterally surround the drain and drift regions 46, 50. The gate structure 54 may thus also surround the drain and drift regions 46, 50. In other cases, the device 20 may include a centrally disposed or inner body region. In still other cases, the drain region 46 may not be centered or otherwise disposed inward of, or laterally surrounded by, the source region 44 as shown. For instance, in non-symmetrical layouts, the source and body regions 44, 48 are not ring-shaped. For example, the source region 44 may have a rectangular layout.

The configuration of the gate structure 54 may vary. For example, the gate structure 54 may be arranged in a dual gate finger configuration in which two transistors are symmetrically arranged to share the same drain region 46. The configuration of the gate structure 54 may include multiple conductive layers (e.g., polysilicon plates). The components, materials, and other characteristics of the gate structure 54 may vary from the example shown.

The STI region(s) 42 are disposed between the gate structure 54 and the drain region 46 to protect the gate structure 54 from the electric field arising from the bias voltage applied during operation. For example, the STI region 42 may be configured to prevent or minimize hot carrier injection (HCI) into the oxide layer of the gate structure 54. The STI region 42 is disposed in the drift region 50 to form a field drift structure. The other STI region(s) 38 define active areas along the periphery of the core device area 36.

A number of other shallow trench isolation (STI) regions may be formed at the surface 40 in the semiconductor substrate 22. For example, an additional STI region may be disposed between the body contact region 52 and the source region 44. Additional, fewer, or alternative STI regions may be disposed in the semiconductor substrate 22 to isolate or separate various contact regions, as well as other regions within the device area 28 of the device 20.

The core device area 36 may vary from the example shown in FIG. 1. For example, the conduction path of the device 20 may be configured with one or more lightly, intermediately, or heavily doped transition regions (e.g., p-type lightly doped drain, or PLDD, regions) at or near the source and drain regions 44 and 46. Each transition region may be or include a diffused region formed in connection with the source or drain region 44, 46. Such transition regions may couple the source region 44 to a channel region 56 (described below). In one example, the device 20 includes a PLDD region adjacent the source region 44. The PLDD region may extend laterally under the gate structure 54.

When the gate structure 54 is biased, charge carriers (in this case, holes; alternatively, electrons) accumulate in one or more channel areas or regions 56. Each channel region 56 (or a portion thereof) may be formed in the body region 48 under the gate structure 54. In this example, the accumulation of holes results in a charge inversion in the channel region 56 from the n-type of the body region 48 to an p-type conduction layer or area near the surface 40 of the semiconductor substrate 22. Once a sufficient amount of the charge carriers accumulate in the conduction layer or area, charge carriers are capable of flowing from the source region 44 toward the drain region 46 through the channel region 56.

The channel region 56 may include other regions or areas in the semiconductor substrate 22 in which charge inversion or accumulation occurs as a result of the bias applied to the gate structure 54. Charge carriers may also accumulate outside of or beyond the body region 48. For example, charge carriers may accumulate in a region of the epitaxial layer 24 between the body region 48 and the drift region 50, as well as in an accumulation region 58 or portion of the drift region 50 near the surface 40 under the gate structure 54.

After exiting the channel region 56, the charge carriers drift through the accumulation region 58 and the drift region 50 to reach the drain region 46. The drift region 50 electrically couples the drain region 46 and the channel region 56. The drift region 50 may be configured to allow the charge carriers to drift under the electric field established by the drain-source voltage applied between the drain region 46 and the source region 44. In this example, the drift region 50 is a p-type well that laterally extends under the STI region 42 as a field drift region.

The drift region 50 may be configured to be depleted to reduce the magnitude of the electric field in areas in and/or around the drift region 50 via the reduced surface field (RESURF) effect to increase the voltage at which breakdown occurs along the conduction path of the device 20. In this example, the drift region 50 is depleted both laterally and vertically. A junction forms between the p-type well of the drift region 50 and the n-type body region 48 to establish a lateral RESURF effect. The junction is reverse-biased as a result of the application of a bias voltage Vds between the source and body regions 44, 48 and the drain region 46. The drift region 50 is also depleted vertically by the n-type buried isolation layer 30 disposed under the drift region 50. The depletion of the drift region 50 allows a portion of the bias voltage to be disposed across the drift region 50, thereby lowering the likelihood of breakdown and/or other problems near the channel region 56.

Protection against breakdown at or near the periphery of the device area 28 is also provided through partial biasing of the doped isolation barrier. Biasing the doped isolation barrier helps to isolate the device 20 from the remainder of the substrate 22. However, the buried isolation layer 30 and other components of the doped isolation barrier are biased at a voltage level lower than the voltage applied to the body region 48 (the "body voltage"). The full body voltage is not directly applied to the doped isolation barrier to raise the voltage at which breakdown occurs between the drift region 50 and the doped isolation barrier (e.g., the buried isolation layer 30). Instead, the potential of the doped isolation barrier is instead partially lifted to the voltage level of the body voltage. In that way, the voltage stress between the drift region 50 and the doped isolation barrier is lowered.

The body region 48 is spaced from the doped isolation barrier to allow the voltage level of the doped isolation barrier to be partially lifted. In the example of FIG. 1, a portion of the epitaxial layer 24 is disposed between the body region 48 and the doped isolation barrier. The epitaxial layer 24 may provide both lateral and vertical spacing. In this specific case, the epitaxial layer 24 is positioned between the isolation well 32 and the body region 48, as well as between the buried isolation layer 30 and the body region 48. A buried well region 60 is also disposed between the buried isolation layer 30 and the body region 48. The buried well region 60 is electrically floating. The buried well region 60 may be disposed under, and in contact with, the body region 48. The buried well region 60 may have a layout that matches the layout of the body region 48. In other embodiments, the buried well region 60 may have a layout smaller or larger than the body region 48.

The partial biasing of the doped isolation barrier is provided by a depletion region 62 disposed in the semiconductor substrate 22. The depletion region 62 electrically couples the body region 48 and the doped isolation barrier. A voltage drop develops across the depletion region 62 because the depletion region 62 is depleted of charge carriers. With a portion of the body voltage supported by the depletion region 62, only part of the body voltage reaches the doped isolation barrier. The doped isolation barrier is thus not electrically tied to the body region 48. The doped isolation barrier is instead biased at a voltage level lower than the body voltage.

The depletion region 62 is positioned and configured to establish an electrical link between the buried doped isolation layer 30 and the body region 48 such that the buried doped isolation layer 30 is biased at a voltage level lower than the body voltage. The depletion region 62 reaches a depth in the semiconductor substrate 22 to be in contact with the buried doped isolation layer 30. The depletion region 62 has a conductivity type in common with the buried doped isolation layer 30 and other regions of the buried doped isolation barrier. In this case, the depletion region 62 has n-type conductivity.

The depletion region 62 may be a singular or composite region disposed within the core device area 36. The depletion region 62 may include any number of wells or other regions disposed in various arrangements and formed via any number of implants or other doping procedures. In the example of FIG. 1, the depletion region 62 includes a depleted well region 64. In this example, the depleted well region 64 is an n-type well positioned between, and in contact with, the body region 48 and the buried doped isolation layer 30. The depleted well region 64 may be formed from one or more implants configured such that the depleted well region 64 extends from the body region 48 to reach the buried doped isolation layer 30.

The depleted well region 64 is depleted via its proximity to one or more regions of opposite conductivity type. In this example, the depleted well region 64 is in contact with the buried well region 60 and the drift region 50. An upper portion of the depleted well region 64 is positioned adjacent the drift region 50. A lower portion of the depleted well region 64 is positioned adjacent the buried well region 60. In some cases, a portion of the depleted well region 64 is disposed between the buried well region 60 and the drift region 50. In this case, the buried well region 60 laterally surrounds the depleted well region 64, and the depleted well region 64 laterally surrounds the drift region 50. Another portion of the depleted well region 64 extends laterally inward from the buried well region 60 and under the drift region 50.

The depleted well region 64 may be disposed at, and extend downward from, the surface 40 of the substrate 22. As shown in the example of FIG. 1, the upper portion of the depleted well region 64 may be disposed between the body region 48 and the accumulation region 58. With the depleted well region 64 at the surface 40 having the same conductivity type as the body region 48, a portion of the channel region 56 may be formed in the depleted well region 64.

The depleted well region 64 may be a lightly doped well region. For instance, the depleted well region 64 may have a dopant concentration level slightly above the p-type dopant concentration level of the epitaxial layer 24 in which the region 64 is formed. The depleted well region 64 and the body region 48 may be formed by a single implant or multiple implants. In the latter case, as shown in FIG. 1, the body region 48 may have a different (e.g., higher) dopant concentration level than the depleted well region 64. The lower dopant concentration level of the depleted well region 64 allows the depleted well region 64 to be more easily depleted of charge carriers than, for instance, the body region 48. An example of a single well arrangement of the single implant case is shown and described in connection with FIG. 2.

In the example of FIG. 1, the depleted well region 64 includes a link section or portion 66 disposed laterally between the body region 48 and the drift region 50. The link portion 66 extends vertically to connect the body region 48 and the buried doped isolation layer 30. The link section 66 establishes the electrical link that partially biases the doped isolation barrier. In the example of FIG. 1, the link portion 66 is a vertically oriented section of the depleted well region

64. An upper end of the link portion 66 is in contact with, and disposed laterally between, the body region 48 and the drift region 50. A lower end of the link portion 66 is in contact with, and reaches the depth of, the buried doped isolation layer 30. In between the upper and lower ends, the link portion 66 vertically extends past the drift region 50 and/or the buried doped well 60.

The depletion region 62 may be fully or partially depleted of charge carriers. In the example of FIG. 1, one or more sections or portions of the depletion region 62 may not be entirely or fully devoid of charge carriers. For example, a section or portion 68 of the depletion region 62 sufficiently spaced from the oppositely doped region(s) (e.g., the drift region 50) may not be fully depleted. Alternative or additional portions may also be partially depleted. In these and other cases, the depletion region 62 (or depleted well region 64) is nonetheless referred to as depleted because the link portion 66 of the depletion region 62 is substantially or sufficiently depleted of charge carriers to establish the electrical link between the body region 48 and the buried doped barrier layer 30. Thus, the terms "depleted" and "depletion" are used herein to denote an effective lack of charge carriers. The extent of the voltage drop across the depleted well region 64 may vary in accordance with the extent to which the depletion region 62 (e.g., the depleted well region 64) is depleted of charge carriers.

The extent to which the depleted well region 64 is depleted of charge carriers may be enhanced by one or more regions, structures, and/or other characteristics located in or near the core device area 36. Depletion is accomplished in the lateral direction in the example of FIG. 1 through the presence of the drift region 50, the buried well region 60, and a portion 70 of the epitaxial layer 24 between the buried well region 60 and the buried doped isolation layer 30. The portion 70 of the epitaxial layer 24 may correspond with an outer section of the epitaxial layer 24 not doped by the implant(s) used to form the depleted well region 64.

The extent of the depletion may be enhanced laterally from both sides of the depleted well region 64. In the example of FIG. 1, depletion of the depleted well region 64 may be enhanced through proximity to another portion 72 of the epitaxial layer 24. The portion 72 may be laterally centered within the core device area 36 and vertically disposed between the drift region 50 and the buried isolation layer 30. The depleted well region 64 may laterally surround the portion 72. The portion 72 may correspond with a central section of the epitaxial layer 24 not doped by the implant(s) used to form the depleted well region 64. The lateral extent of the portion 72 (and thus the lateral position of the boundary(ies) between the portion 72 and the depleted well region 64) may vary from the example shown.

The depletion region 62 may not be fully depleted of charge carriers when the body bias voltage is low. The lack of full depletion may extend beyond the portion 68. In some cases or circumstances (e.g., an extremely low body voltage), for instance, the entire depletion region 62 is not fully depleted. During these conditions, the potential of the buried doped isolation layer 30 follows the body voltage until at least a portion of the depletion region 62 is fully depleted. At that point, a certain voltage drop is observed between the body region 48 and the buried doped isolation layer 30. Thus, depending on the operating conditions, the buried doped isolation layer may be biased at a voltage level equal to, or lower than, the body voltage. The depletion region 62 is nonetheless still referred to as a depletion region herein despite the possibility for such variance in operating conditions.

The buried well region 60 may be a floating region having a layout that matches a layout of the body region 48. The buried well region 60 may be formed via an implant (e.g., a p-type implant) that relies on the same mask as the implant (e.g., an n-type implant) used to form the body region 48. The buried well region 60 may thus have a layout that corresponds with the body region 48. In the example of FIG. 1, the buried well region 60 is spaced from the buried doped isolation layer 30 by the portion 70 of the epitaxial layer 24. The depth of the buried well region 60 may vary from the example shown. For instance, the buried well region 60 may reach the buried isolation layer 30 if depletion of the end of the link portion 66 would otherwise be problematic due to, for instance, the lower dopant concentration level and thickness of the portion 70.

The above-described regions involved in the partial biasing of the doped isolation barrier may be formed without increasing the complexity or cost of fabricating the device 20. For instance, and as described below in connection with the exemplary fabrication process shown in FIG. 3, the implant(s) used to form the depleted well region 64 may be a preexisting implant(s). Furthermore, in the example of FIG. 1, the n-type and p-type implants used to form the body and buried well regions 48, 60 may also be preexisting implants configured with the same mask, insofar as the layout of the n-type and p-type regions may be the same.

The presence of the depleted well region 64 may not result in any increase in device footprint. The periphery of the device area 28 corresponds with the portion of the device area 28 outside of the core device area 36. The size of the periphery may not increase because the depleted well region 64 does not necessitate changes to a peripheral portion 74 of the epitaxial layer 24 that laterally separates the body region 48 from the well(s) 32 of the doped isolation barrier.

The arrangement of the depletion region 62 of the device 20 may instead enable area savings to be realized. As shown in FIG. 1, the biasing of the doped isolation barrier is achieved without having to rely on another contact to provide a voltage to the doped isolation barrier. For instance, the device 20 does not include an isolation contact or isolation contact region. Moreover, the resulting area savings may be significant for some types of devices, such as analog devices, for which the device periphery constitutes a considerable fraction of the total device area 28.

The position and extent of the depleted well region 64 may vary from the example shown in FIG. 1. For instance, the depleted well region 64 may have a lesser vertical extent. For instance, the depleted well region 64 may not be connected with the channel region as in the example of FIG. 1. In one example, the depleted well region extends downward from a depth that corresponds with a bottom surface of the body region 48. The depleted well region may thus be disposed entirely below the body region 48. In that and other cases, the depleted well region 64 may thus not reach the substrate surface 40 or the level at which the channel is forming under the gate. In some cases, a portion of the epitaxial layer 24 may be disposed between the depleted well region and the accumulation region of the device. Alternatively or additionally, the depleted well region 64 may be laterally adjacent to the accumulation region 58. In these and other cases, the depleted well region 64 may be a buried well region or be otherwise vertically spaced from the surface 40. Any effect on the threshold voltage of the device 20 may thus be reduced, minimized or avoided.

The position of the depleted well region may differ from the example of FIG. 1 in other ways. For example, the relative positions of the depleted well region and the buried well region may differ from the example of FIG. 1. In some cases, for instance, a portion of the epitaxial layer 24 is laterally disposed between the depleted well region and the buried well region. The spacing and lateral positions of the depleted well region and the buried well region may thus vary.

The outer lateral boundary of the depleted well region 64 may vary from the example shown. The outer lateral boundary is positioned at the interface between the depleted well region 64 and the body region 48. For instance, the outer lateral boundary may be shifted to modify the length of the channel region 56 and/or the lateral size of the link portion 66 of the depleted well region 64.

The lateral positioning of the inner boundary of the link portion 66 of the depleted well region 64 may also vary. The implant used to form the depleted well region 64 may not laterally overlap the accumulation region and drift region as in the example of FIG. 1. The inner boundary may establish the interface between the accumulation region 58 and the depleted well region 64. The lateral positioning of the interface may thus also vary. The lateral sizes of the depleted well region 64 and the accumulation region 58 may vary accordingly.

The lateral extent of the depleted well region 64 may also vary outside of the link portion 66, such as the extent to which the depleted well region 64 and the drift region 50 laterally overlap. The lateral overlap of the drift region 50 and the depleted well region 64 may be present to accommodate a minimal opening width of a pre-existing implantation procedure used to form the depleted well region 64. In other cases, the lateral overlap may be reduced considerably (e.g., to a point at which the depleted well region 64 is or nearly aligned, i.e., line-on-line, with the drift region 50). Thus, the extent to which the depleted well region 64 laterally extends under the drift region 50 may vary. In some cases, the drift region 50 and the depleted well region 64 do not laterally overlap.

The lateral and/or vertical extent of the buried well region 60 may be modified to change the size and/or extent (e.g., vertical extent) of the gap between the drift region 50 and the buried well region 60.

In some cases, the body region 48 and the depleted well region 64 constitute contiguous or other portions of a single well in the epitaxial layer 24 of the substrate 22. An example of this arrangement is shown and described in connection with FIG. 2. Other contiguous and non-contiguous arrangements of the body region 48 and the depleted well region 64 may be used. For example, the depleted well region 64 may be laterally adjacent to additional and/or alternative regions or layers of the depletion region 62. In some cases, the depletion region 62 includes one or more buried wells disposed between the drift region 50 and the depleted well region 64.

Figure 2:
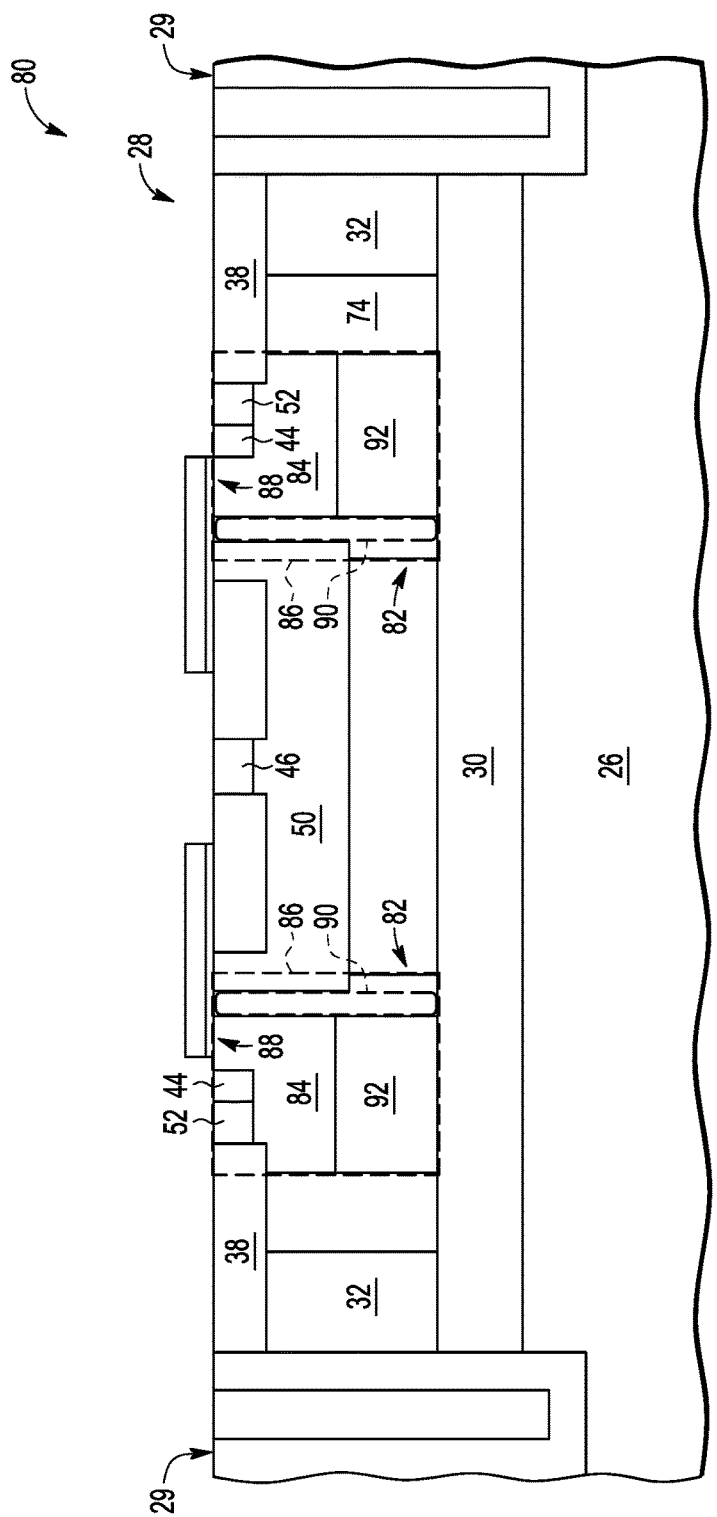
FIG. 2 is a cross-sectional, schematic view of another exemplary p-channel LDMOS transistor with self-biased isolation in accordance with one embodiment.

FIG. 2 depicts a device 80 having partially biased isolation in accordance with one embodiment. The device 80 is configured similarly in many respects to the examples described above in connection with FIG. 1. For instance, the device 80 has a device area 28 defined by DTI region 29 and a doped isolation barrier having buried isolation layer 30 and one or more isolation wells 32. The device 80 is also symmetrical about a drain region 46. The source region 44, body contact region 52, and other regions and structures within the device area 28 of the device 80 may be disposed, arranged, and otherwise configured as described above in connection with FIG. 1, except as noted below. Unless noted otherwise below, the structures, components, and other elements of the device 80 may be configured as described above in connection with FIG. 1.

The device 80 differs from the above-described examples in the configuration of a depletion region 82 and a body region 84. In this case, the depletion region 82 and the body region 84 are constituent sections of a single well rather than multiple, separate wells or other regions. With a single well, the various portions or sections of the depletion region 82 and the body region 84 have the same dopant concentration profile. The single well may be formed via one or more implants configured for doping across an area 86. In the symmetrical example of FIG. 2, the area 86 may be a ring-shaped area within the core device area 36 that surrounds a drift region 50. The area 86 may extend laterally beyond a source region 44 and a body contact region 52 such that the body region 84 laterally overlaps an STI region 38 to any desired extent. The area 86 may extend laterally inward to establish both a channel region 88 of the body region 84 and a link portion 90 of the depletion region 82. The inner boundary of the area 86 may be positioned such that the depletion region 82 laterally overlaps the drift region 50 to any desired extent. The outer boundary of the area 86 may be positioned such that a peripheral portion 74 of the epitaxial layer is again disposed between the body region 84 and the isolation well 32(s), as described above in connection with FIG. 1. The lateral extent of the single well may vary as described above in connection with the depletion region 62 of the example of FIG. 1.

The common dopant concentration profile of the depletion region 82 and the body region 84 may be non-uniform as a function of depth. For instance, the dopant concentration level may taper off with increasing depth. A lower dopant concentration level at greater depths may make depletion of the depletion region 82 easier and/or more comprehensive. The other depletion regions described hereinabove may be configured with a similar dopant concentration profile.

The function of the link portion 90 may be similar to the corresponding region described above in connection with the example of FIG. 1. For instance, the link portion 90 is in contact with the buried doped isolation layer 30 to establish the electrical link with the body region 84.

The link portion 90 is depleted in a manner similar to the above-described examples. For instance, the link portion 90 may be depleted by the drift region 50 and a buried well region 92. The buried well region 92 is floating as described above. The buried well region 92 may be formed via one or more implants of an opposite conductivity type (e.g., p-type) than the conductivity type of the depletion region 82 and the body region 84. The buried well region 92 may be in contact with the buried doped isolation layer 30 as shown, or be spaced therefrom as described above. The spacing, positioning, and/or dopant conductivity levels of the buried well region 92 may be selected to reduce the possibility of punch through and/or other breakdown.

The depletion region may thus be formed separately or in conjunction with the body region of the above-described embodiments. Thus, in some cases, the body region and one or more portions of the depletion region may have a common dopant concentration profile.

The above-described devices are shown in simplified form. For example, FIGS. 1 and 2 do not depict an Ohmic metal layer (e.g., a metal-one layer) used to form various electrodes. FIGS. 1 and 2 also do not show a number of other metal layers configured for interconnections with the electrodes. The devices may have a number of other structures or components for connectivity, isolation, passivation, and other purposes not shown in FIGS. 1 and 2 for ease in illustration. For instance, the devices may include a number of additional backside layers.

The dopant concentrations, thicknesses, and other characteristics of the above-described semiconductor regions in the semiconductor substrate 22 may vary. In one example of the embodiment shown in FIG. 1, the above-referenced semiconductor regions may have the following approximate concentrations and thicknesses:

|  | Concentration | Thickness |
| --- | --- | --- |
| p-epi 24: | $1 \times 10^{13}$-$1 \times 10^{16}$/cm$^3$ | 2-10 μm |
| substrate 26: | $1 \times 10^{14}$-$1 \times 10^{18}$/cm$^3$ | not applicable |
| buried layer 30: | $1 \times 10^{16}$-$5 \times 10^{19}$/cm$^3$ | 0.5-3.5 μm |
| well 32: | $1 \times 10^{16}$-$1 \times 10^{19}$/cm$^3$ | 1-5 μm |
| body 48: | $1 \times 10^{16}$-$1 \times 10^{19}$/cm$^3$ | 0.5-0.5 μm |
| source 44: | $1 \times 10^{20}$-$1 \times 10^{23}$/cm$_3$ | 0.1-0.5 μm |
| drain 46: | $1 \times 10^{20}$-$1 \times 10^{23}$/cm$^3$ | 0.1-0.5 μm |
| drift 50: | $1 \times 10^{15}$-$1 \times 10^{18}$/cm$^3$ | 0.2-3 μm |
| buried 60: | $1 \times 10^{15}$-$1 \times 10^{18}$/cm$^3$ | 0.2-3 μm |
| depleted 64: | $1 \times 10^{15}$-$1 \times 10^{18}$/cm$^3$ | 1-5 μm |

The concentrations and thicknesses may be different in other embodiments. For example, the dopant concentration of the bulk substrate 26 may vary considerably.

Various symmetrical and asymmetrical layouts may be used for the devices 20, 80 of FIGS. 1 and 2. For example, the gate structures may be U-shaped or arch-shaped (e.g., a single lateral connection) or toroidal or looped (e.g., two lateral connections) or rectangular (e.g., connected by metal line(s) from one or both ends) when viewed from above. In such cases, one or more regions of the devices 20, 80 may nonetheless be considered central or centered despite the lack of symmetry in the other lateral dimension. The devices 20, 80 may thus be laterally symmetrical in zero, one or both lateral dimensions. The layouts of the above-described regions of the devices 20, 80 may vary considerably from these examples.

The layout of the devices 20, 80 may differ from the examples shown in other ways. For example, each gate structure 54 may be or include two spaced apart structures. The first structure is positioned above the body region 48 to establish the channel region 56 and the accumulation region 58, while the second structure may be positioned above the STI region 42 (FIG. 1). The periphery of the second structure may be laterally spaced inward from the edges of the STI region 42. The two structures may be biased at the same or different gate potential.

Figure 3:
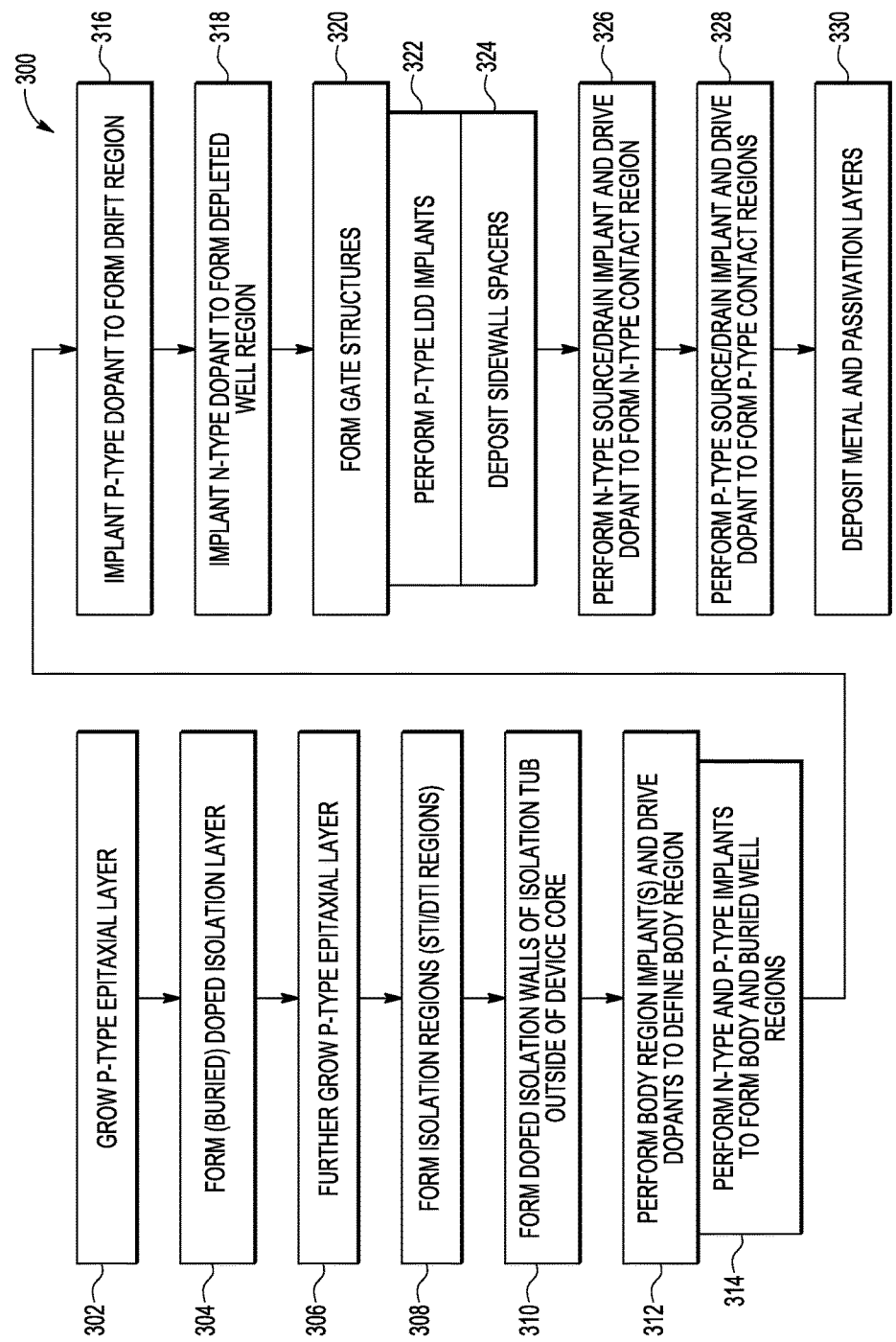
FIG. 3 is a flow diagram of an exemplary fabrication sequence to construct p-channel LDMOS transistors having self-biased isolation in accordance with one embodiment.

FIG. 3 shows an exemplary method 300 for fabricating one or more of the above-described devices. In this example, the method 300 is configured to fabricate a p-channel device. The device may be an LDMOS device having a RESURF configuration and one or more of the above-described features directed to partially biasing a doped isolation barrier. The devices are fabricated with a p-type bulk semiconductor substrate, the regions or layers of which may have the conductivity types of the p-channel examples described above, or be alternatively fabricated with an n-type substrate. The method includes a sequence of acts, only the salient of which are depicted for convenience in illustration.

The ordering of the acts may vary in other embodiments. For example, an act directed to forming isolation wells may be implemented after one or more acts configured to form the regions located within a core device area.

The method 300 may begin with one or more acts directed to the growth or other formation of one or more epitaxial layers. In this example, a p-type epitaxial layer is grown on a p-type bulk substrate in an act 302. In some cases, e.g., where the p-type bulk substrate is lightly doped, the act 302 may be optional, e.g., in the interest of reducing process costs. During or after the formation of the epitaxial layer, a doped isolation layer is formed in an act 304. The act 304 may include a dopant implantation or other doping technique. In other cases, the isolation layer is formed before the growth of an epitaxial layer. In some cases, the method 300 then includes growth (e.g., further growth) of a p-type epitaxial layer in an act 306. As a result, the doped isolation layer becomes a buried doped isolation layer.

The lower biasing of the isolation regions of the device as described herein may allow the thickness of the epitaxial layer(s) to be minimized or reduced. The method 300 may accordingly include only a single epitaxial layer. In such cases, the act 304 may be implemented before, during, or after formation of the single epitaxial layer. In the latter case, a deep implant may be used to form the buried doped isolation layer.

In the example of FIG. 3, a number of STI regions and DTI structures are formed in an act 308. The STI regions may be used to define and separate active areas within and outside of the core device area. One or more STI regions may also be used to space a drain region from a gate structure in a field drift arrangement, as described above. The DTI structures may be ring-shaped to define a device area for the device. In some cases, the act 308 is implemented after implementation of one or more of the implantation procedures described below.

The STI regions and DTI structures may be formed via any now known or hereafter developed procedure. In some cases, the act 308 may include the formation of a trench and the deposition (e.g., chemical vapor deposition, or CVD) of one or more materials in the trench. In some embodiments, the trench is filled with silicon oxide. Additional or alternative materials may be deposited.

In an act 310, an implantation is performed to form a region of a doped isolation barrier. The region may be a well region disposed along a sidewall of the doped isolation barrier. The implantation may be configured to form one or more isolation wells, which may be vertically stacked upon one another to define the sidewall. The isolation wells may be positioned to extend upward from the buried doped isolation layer such that doped isolation barrier is shaped as an isolation tub. The isolation wells may be disposed at and along the DTI structure, as described above. The act 310 may be performed at various points in the fabrication procedure.

One or more dopant implantations are performed in an act 312 to form one or more well regions. A body region is formed by, e.g., an n-type dopant implantation of the act 312. A number of regions of the p-channel device may be formed in addition to the n-type dopant implantation. In the example of FIG. 3, another (e.g., p-type) dopant implantation of the act 312 is used to form a buried well region under the body region. Each implantation may be configured to form a ring-shaped well region or multiple well regions. The dopant implantations of the act 312 may, but need not, use a common mask. In some cases, a region formed in the act 312 may perform multiple functions, such as, for example, the region formed in the example described above in connection with the example of FIG. 2. For instance, the implantation of act 312 may be configured such that a single well region has a portion configured as a body region and a portion configured as a depletion region disposed between a region (e.g., an isolation well region) of the doped isolation barrier and the body region.

In the example of FIG. 3, the act 312 includes performing both n-type and p-type implantations in an act 314. The n-type implantation is configured to form a body region. In other cases, the implantation is configured to form both a body region and a depleted well region as portions of a single well, as described above. The depleted well region is (or includes) the portion of the single well that establishes the electrical link between the body region and the buried doped isolation layer. The electrical link supports the partial biasing of the doped isolation barrier, as described above.

The p-type implantation of the act 314 may be directed to forming one or more buried well regions used to deplete the depleted well region. The p-type implantation may be configured such that a buried well region is in contact with the depleted well region. In some cases, the n-type and p-type implantations of the act 314 use the same mask.

Further p-type and n-type implantation procedures may be performed in acts 316, 318 to form the drift and depleted well regions, respectively. The implantations are configured to position the regions for depletion of the depleted well region as described above. The order in which these and other implantation procedures are implemented may vary from the order shown in FIG. 3.

The implantation of act 318 is configured such that the depleted well region establishes an electrical link between the buried doped isolation layer and the body region such that the buried doped isolation layer is biased at a voltage level lower than the voltage applied to the body region (when the body voltage is sufficiently high). To that end, the implantation of the act 318 is configured as a deep implant such that the depleted well region reaches a depth in the semiconductor substrate to be in contact with the buried doped isolation layer. The extent to which the depleted well region is at or near the surface of the substrate may vary as described above. The implantations of acts 314, 318 may be configured such that the buried well region is disposed laterally adjacent to, and in contact with, the depleted well region to deplete the depleted well region.

The implantation of act 318 may be a lightly doped implant to support the depletion of the depleted well region. The dopant concentration level of the depleted well region may fall in a range from about $1 \times 10^{15}$-$1 \times 10^{18}$/cm$^3$. In one example, the dopant concentration level of the depleted well region is about $1 \times 10^{16}$/cm$^3$. The depleted well region may have a lower or comparable dopant concentration level than both the body region and the buried doped isolation layer. Dopant concentration levels in this range are useful because the implantation may be heavy enough to surpass the level of the epitaxial layer but still low enough to promote depletion.

The areas into which dopant is implanted during the above-described acts may overlap. For example, the dopant implantation areas established via the respective layout masks for acts 312 and 318 may overlap. The lateral positioning of the effective interface between the body region and the depleted well region may vary accordingly. The implantation areas for acts 316 and 318 may also overlap to a varying extent, as described above.

In some cases, the implantation of act 318 is a pre-existing implantation procedure. For example, the implantation may be configured to also form a drift region of another FET device formed in the semiconductor substrate. The partial, self-biasing of the doped isolation barrier may thus be achieved without added fabrication costs.

The fabrication process may then include one or more procedures collectively shown in act 320. The procedures may be implemented in various orders. Additional or alternative procedures may be implemented. One or more components of gate and conductive flap structures may be initially formed. For instance, a gate dielectric layer and conductive plate may be deposited and patterned to form the gate and flap structures. A number of implantations may then be performed in an act 322 to form one or more LDD regions, e.g., adjacent the gate structure. After the dopant for the LDD regions is implanted, sidewall spacers may then be deposited along each gate structure in an act 324. The sidewall spacers and/or other components of the gate structure may then be used for self-alignment of a source region.

In acts 326 and 328, n-type and p-type source/drain implantations are performed to form the various n-type and p-type contact regions of the device, respectively. Source and drain regions may thus be formed. The n-type body contact region of the p-channel device is also formed.

A number of metal and passivation layers may then be deposited on the substrate in an act 330. The metal layers may be patterned to form Ohmic contacts and electrodes, metal flap structures, and various interconnects.

Additional, fewer, or alternative acts may be implemented. For example, any number of epitaxial layers may be grown on the original, bulk substrate. A number of acts are optional, including, for instance, acts related to elements or aspects of a gate structure or the channel, such as the formation of sidewall spacers and LDD regions.

Transistor devices having a controllable depletion region (e.g., depleted well region) are described above. The depletion region provides a soft electrical connection (rather than a hardwired connection) between the body voltage and the isolation regions of the device. The voltage drop across the depletion region provides a self-adjusted differential potential for the isolation regions. The lower voltage on the isolation regions improves the vertical junction breakdown limit for the device by, for instance, relaxing the vertical electrical field stress within the core device area (e.g., under the device drain, or drift region). The RESURF effect may thus be utilized to attain higher breakdown voltage levels (e.g., BVdss levels) without sacrifices in device size. For example, an increase in the thickness of the epitaxial layer(s) may be avoided as a result of the lower biasing of the isolation regions. Improvements in both high-side and low-side operation are realized.

Although described in connection with p-channel LDMOS transistors, the disclosed devices are not limited to any particular transistor configuration. The partial isolation biasing of the disclosed devices may be useful in a wide variety of power electronic devices. For instance, application of the features of the disclosed devices is not limited to LDMOS or other power MOS devices. The partial isolation biasing is also not limited to any one particular type of RESURF configuration. The disclosed devices may have varying RESURF structures, including single, double, or other RESURF structural arrangements, each of which may be referred to herein as a "RESURF transistor."

For convenience of description and without any intended limitation, p-channel LDMOS devices with a p-type substrate are described and illustrated. However, the disclosed devices are not limited to p-type substrates, such that other types of devices may be provided by, for example, substitution of semiconductor regions of opposite conductivity type. Thus, for example, each semiconductor region, layer or other structure in the example described in connection with FIGS. 1 and 2 may have a conductivity type (e.g., n-type or p-type) opposite to the type identified in the examples below.

In a first aspect, a device includes a semiconductor substrate, a buried doped isolation layer disposed in the semiconductor substrate to isolate the device, a body region disposed in the semiconductor substrate and to which a voltage is applied during operation and in which a channel is formed during operation, and a depletion region disposed in the semiconductor substrate and having a conductivity type in common with the buried doped isolation barrier and the body region, the depletion region reaching a depth in the semiconductor substrate to be in contact with the buried doped isolation layer. The depletion region establishes an electrical link between the buried doped isolation layer and the body region such that the buried doped isolation layer is biased at a voltage level lower than the voltage applied to the body region.

In a second aspect, a device includes a semiconductor substrate, a doped isolation barrier disposed in the semiconductor substrate, having a first conductivity type, and including a buried doped isolation layer, a body region disposed in the semiconductor substrate, having the first conductivity type, to which a voltage is applied during operation, and in which a channel is formed during operation, a drift region disposed in the semiconductor substrate within the device area, having a second conductivity type, and through which charge carriers drift during operation after exiting the channel, and a depleted well region having the first conductivity type and positioned between, and in contact with, the body region and the buried doped isolation layer. The depleted well region establishes an electrical link between the buried doped isolation layer and the body region, and the doped isolation barrier and the body region are not electrically tied to one another.

In a third aspect, a method of fabricating a transistor includes forming a buried doped isolation layer, performing a first implantation to form a body region to which a voltage is applied during operation and in which a channel is formed during operation, and performing a second implantation to form a depleted well region of the transistor, the first and second implantations configured to implant dopant of a common conductivity type. The second implantation is configured such that the depleted well region reaches a depth in a semiconductor substrate to be in contact with the buried doped isolation layer. The second implantation is configured such that the depleted well region establishes an electrical link between the buried doped isolation layer and the body region such that the buried doped isolation layer is biased at a voltage level lower than the voltage applied to the body region.

References to a well region or other doped region of a semiconductor having a certain conductivity type are intended to specify that the region has a net dopant concentration of the type indicated to support the indicated conductivity type. The region may have dopant of the other conductivity type therein, but the amount of such opposite dopant is insufficient to change the effective, or net, conductivity type of the region.

Semiconductor devices with a conductive gate electrode positioned over a dielectric or other insulator may be considered MOS devices, despite the lack of a metal gate electrode and an oxide gate insulator. Accordingly, the terms metal-oxide-semiconductor and the abbreviation "MOS" may be used even though such devices may not employ metals or oxides but various combinations of conductive materials, e.g., metals, alloys, silicides, doped semiconductors, etc., instead of simple metals, and insulating materials other than oxides (e.g., nitrides, oxy-nitride mixtures, etc.). Thus, as used herein, the terms MOS and LDMOS are intended to include such variations.

The present invention is defined by the following claims and their equivalents, and nothing in this section should be taken as a limitation on those claims. Further aspects and advantages of the invention are discussed above in conjunction with the preferred embodiments and may be later claimed independently or in combination.

While the invention has been described above by reference to various embodiments, it should be understood that many changes and modifications may be made without departing from the scope of the invention. It is therefore intended that the foregoing detailed description be regarded as illustrative rather than limiting, and that it be understood that it is the following claims, including all equivalents, that are intended to define the spirit and scope of this invention.

The invention claimed is:

1. A device comprising:
   a semiconductor substrate;
   a buried doped isolation layer disposed in the semiconductor substrate to isolate the device;
   a body region disposed in the semiconductor substrate and to which a voltage is applied during operation and in which a channel is formed during operation; and
   a depletion region disposed in the semiconductor substrate and having a conductivity type in common with the buried doped isolation layer and the body region, the depletion region reaching a depth in the semiconductor substrate to be in contact with the buried doped isolation layer;
   wherein the depletion region establishes an electrical link between the buried doped isolation layer and the body region such that the buried doped isolation layer is biased at a voltage level lower than the voltage applied to the body region.

2. The device of claim 1, wherein the depletion region comprises a depleted well region positioned between, and in contact with, the body region and the buried doped isolation layer.

3. The device of claim 2, further comprising a buried well region disposed in the semiconductor substrate under and in contact with the body region, wherein the buried well region is in contact with the depleted well region, and has an opposite conductivity type than the body region and the depleted well region to deplete the depleted well region.

4. The device of claim 3, wherein the buried well region is a floating region having a layout that matches a layout of the body region.

5. The device of claim 2, wherein the depleted well region has a lower dopant concentration level than the body region.

6. The device of claim 2, further comprising a gate structure supported by the semiconductor substrate, wherein:
   the channel is formed in the body region under the gate structure;
   the gate structure defines an accumulation region in the semiconductor substrate in which charge carriers accumulate adjacent the channel during operation, and
   the accumulation region is laterally adjacent to the depleted well region.

7. The device of claim 2, further comprising a drift region through which charge carriers drift after exiting the channel during operation, wherein the depleted well region is in contact with the drift region.

8. The device of claim 7, wherein the depleted well region laterally extends under the drift region to laterally overlap the drift region.

9. The device of claim 1, wherein the body region has a dopant concentration profile in common with the depletion region.

10. The device of claim 1, wherein the body region and the depletion region are constituent sections of a single well region.

11. The device of claim 1, further comprising a doped isolation well that surrounds the body region to isolate the device, wherein:
the doped isolation well is electrically coupled to the buried doped isolation layer; and
the body region is spaced from the buried doped isolation layer by a portion of the semiconductor substrate.

12. The device of claim 1, wherein the depletion region extends from a surface of the semiconductor substrate.

13. The device of claim 1, wherein the depletion region is fully depleted.

14. The device of claim 1, wherein:
the depletion region comprises first and second sections;
the first section is fully depleted and establishes the link; and
the second section is not fully depleted.

15. The device of claim 1, further comprising a doped isolation barrier in the semiconductor substrate, wherein:
the doped isolation barrier comprises the buried doped isolation layer and a ring-shaped well;
the ring-shaped well is disposed along a device periphery;
the ring-shaped well is electrically coupled with the buried doped isolation layer; and
the doped isolation barrier and the body region are not electrically tied to one another.

16. A device comprising:
a semiconductor substrate;
a doped isolation barrier disposed in the semiconductor substrate, having a first conductivity type, and comprising a buried doped isolation layer;
a body region disposed in the semiconductor substrate, having the first conductivity type, to which a voltage is applied during operation, and in which a channel is formed during operation;
a drift region disposed in the semiconductor substrate within the device area, having a second conductivity type, and through which charge carriers drift during operation after exiting the channel; and
a depleted well region having the first conductivity type and positioned between, and in contact with, the body region and the buried doped isolation layer;
wherein the depleted well region establishes an electrical link between the buried doped isolation layer and the body region, and
wherein the doped isolation barrier and the body region are not electrically tied to one another.

17. The device of claim 16, further comprising a floating buried well region having the second conductivity type, wherein:
the floating buried well region is disposed in the semiconductor substrate under and in contact with the body region;
the floating buried well region is laterally adjacent to, and in contact with, the depleted well region;
the depleted well region comprises a fully depleted section disposed between the drift region and the floating buried well region; and
the fully depleted section establishes the electrical link.

* * * * *